(12) United States Patent
Chang

(10) Patent No.: US 6,289,605 B1
(45) Date of Patent: Sep. 18, 2001

(54) METHOD FOR DRYING A SEMICONDUCTOR WAFER

(75) Inventor: Ching-Yu Chang, I-Lan Hsien (TW)

(73) Assignee: Macronix International Co. Ltd., Hsin-chu (TW)

( * ) Notice: Subject to any disclaimer, the term of this patent is extended or adjusted under 35 U.S.C. 154(b) by 0 days.

(21) Appl. No.: 09/506,391

(22) Filed: Feb. 18, 2000

(51) Int. Cl.[7] .................................................. F26B 3/00
(52) U.S. Cl. ................... 34/471; 34/343; 34/404; 34/408; 34/410; 34/417; 34/449; 34/470
(58) Field of Search .................... 34/329, 343, 402–404, 34/406–410, 417, 443, 448, 449, 467–471, 72–74, 78, 92, 107

(56) References Cited

U.S. PATENT DOCUMENTS

| | | | |
|---|---|---|---|
| 4,841,645 | * 6/1989 | Bettcher et al. | 34/470 |
| 5,212,877 | * 5/1993 | Onur et al. | 34/448 |
| 5,315,766 | * 5/1994 | Roberson et al. | 34/409 |
| 5,351,415 | * 10/1994 | Brooks et al. | 34/404 |
| 5,351,419 | * 10/1994 | Franka et al. | 34/470 |
| 5,443,540 | * 8/1995 | Kamikawa | 34/471 |
| 5,551,165 | * 9/1996 | Turner et al. | 34/404 |
| 5,571,337 | * 11/1996 | Mohindra et al. | 134/25.4 |
| 5,634,978 | * 6/1997 | Mohindra et al. | 134/2 |
| 5,772,784 | * 6/1998 | Mohindra et al. | 134/21 |
| 5,815,947 | * 10/1998 | Brooks et al. | 34/404 |
| 5,855,077 | * 1/1999 | Nam et al. | 34/409 |
| 5,878,760 | * 3/1999 | Mohindra et al. | 134/35.2 |
| 5,891,256 | * 4/1999 | Mohindra et al. | 134/2 |
| 5,932,027 | * 8/1999 | Mohindra et al. | 134/21 |
| 5,940,985 | * 8/1999 | Kamikawa et al. | 34/471 |
| 5,950,328 | * 9/1999 | Ichiko et al. | 34/74 |
| 5,953,828 | * 9/1999 | Hillman | 34/74 |
| 5,953,832 | * 9/1999 | Rosynsky et al. | 34/403 |
| 5,956,859 | * 9/1999 | Matsumoto et al. | 34/74 |
| 5,958,146 | * 9/1999 | Mohindra et al. | 134/2 |
| 5,985,041 | * 11/1999 | Florez | 34/78 |
| 6,055,743 | * 5/2000 | Chen et al. | 34/470 |
| 6,067,727 | * 5/2000 | Muraoka | 34/470 |

FOREIGN PATENT DOCUMENTS

404022125 A * 1/1992 (JP) ........................................ 34/406

* cited by examiner

*Primary Examiner*—Pamela Wilson
(74) *Attorney, Agent, or Firm*—Winston Hsu

(57) ABSTRACT

The present invention provides a drying method for removing a residual solution from a semiconductor wafer. The semiconductor wafer is placed into a chamber, and then the air pressure of the chamber is lowered from atmospheric pressure to a lower pressure. Next, an inert gas with a predetermined pressure is injected into the chamber to exchange with the dissolved oxygen in the residual solution. The pressure in the chamber is reduced to 0.5~100 torr so as to lower the boiling point of the solution and to remove the displaced oxygen. Finally, a heating process is performed to completely evaporate the residual solution on the semiconductor wafer.

14 Claims, 3 Drawing Sheets

METHOD FOR DRYING A SEMICONDUCTOR WAFER

BACKGROUND OF THE INVENTION

1. Field of the Invention

The present invention relates to a method of drying a semiconductor wafer, and more particularly, to a method for removing a residual solution, which comprises dissolved oxygen, from the semiconductor wafer.

2. Description of the Prior Art

During semiconductor fabrication processes, some metal ion, particle and organic compound may remain on the surface of the wafer. Native oxides may also form on the semiconductor wafer after cleaning, deposition, etching and conveying processes, degrading the quality of the semiconductor product. One or more cleaning processes are consequently employed to ensure the surface cleanliness of the semiconductor wafer.

In general, there are two types of cleaning processes: wet and dry. The wet cleaning process is wildly employed. After a wet cleaning process, a drying process is performed on the semiconductor wafer to remove any residual water as quickly as possible. The drying process is used to prevent water mark, and their associated defects, from forming on the wafer. Water mark occur when dissolved oxygen (DO) in the water reacts with the bare silicon on the surface of the semiconductor wafer.

Methods for drying semiconductor wafers according to the prior art include spin drying, IPA vapor drying and Marangoni drying, etc. Each of these drying methods has shortcomings. In order to improve the yield of the semiconductor manufacturing process, and also to avoid environmental pollution from chemical solutions used in some drying processes, a fast and effective drying process must be developed that does not use chemical solutions.

Please refer to FIG. 1. FIG. 1 is a cross-sectional diagram of spin drying a semiconductor wafer 10 according to the prior art. The surface of the semiconductor wafer 10 comprises many metal-oxide-semiconductor (MOS) transistors 14, trenches 16 and contact holes 18. Droplets 11 remain in the trenches 16 and contact holes 18 of the semiconductor wafer 10. Spin drying uses centrifugal force to remove the droplets 11 from the surface of the semiconductor wafer 10. The wafer 10 is spun at high speeds and at room temperature to quickly dry its surface. About six minutes per batch of wafers are required for the drying process. In FIG. 1, the arrow 17 indicates the direction of rotation of the semiconductor wafer 10 spinning around an axis of rotation 15. The arrows 19 indicate the centrifugal force during the spinning process.

In general, the wafer rotational speed must be at least 3500 rpm (revolutions per minute) to ensure a complete removal of the droplets 11 from the surface of the semiconductor wafer 10. However, excessive rotational speeds can lead to damage to the electric devices on the semiconductor wafer 10. The speed of rotation is therefore usually set to 3000 rpm when spin drying according to prior art. Because the rotational speed is insufficient, water marks form on the semiconductor wafer 10. Furthermore, dissolved oxygen in the water marks can cause additional defects on the semiconductor wafer 10.

When using the prior art spin drying method to dry the semiconductor wafer 10, the centrifugal drying effect is reduced due to the surface structure of the semiconductor wafer 10. This structure comprises many trenches and walls, which are a consequence of the many devices on the surface. The droplets 11 are trapped within the trenches 16 and contact holes 18, and so are difficult to remove by the centrifugal force 19 of the spin drying method. Another problem with spin drying is the issue of static charge. During the high-speed spinning of the semiconductor wafer 10, it accumulates static charge. This charge attracts particles in the air, thereby reducing the surface cleanliness of the semiconductor wafer 10.

Please refer to FIG. 2. FIG. 2 is a schematic diagram of a prior art IPA vapor drying process of the semiconductor wafer 10. In FIG. 2, the arrows 21 indicate the vertical direction of an upwardly flowing IPA (isopropyl alcohol) vapor. This IPA vapor drying process uses a heater 32 to evaporate an IPA solution 12, thereby forming the IPA vapor. Next, the semiconductor wafer 10 is placed inside the heated vapor of the IPA solution 12, and condensed IPA replaces the water adhering to the surface. Finally, the water and the condensed IPA are together taken away through a collector 36 and a pipe 38, completing the drying of the semiconductor wafer 10. About 10 min/batch is required for the IPA vapor drying process.

However, the droplets 11 in the trenches 16 and contact holes 18 are not easily replaced by condensed IPA 12. The IPA process does, however, avoid charge accumulation. It also requires the use of a great deal of IPA solution, which can lead to a lot of environmental pollution.

Please refer to FIG. 3. FIG. 3 is a side view of a prior art Marangoni drying process of a semiconductor wafer 20. The Marangoni drying method involves slowly removing the semiconductor wafer 20 vertically from a washing tank (not shown), at a suitable speed and at room temperature, then using a nitride gas 23 and an IPA vapor 21 to blow dry the semiconductor wafer 20. When the semiconductor wafer 20 is exiting from the surface 24, a bent region is formed between the semiconductor wafer 20 and a meniscus 22 between gas and liquid, into which the IPA vapor 21 dissolves. This reduces the surface tension of the water, preventing the semiconductor wafer 20 from dripping water. The advantage of the Marangoni drying method is that it uses less IPA solution. But it is still difficult to replace the droplets of water in trenches and contact holes with condensed IPA.

SUMMARY OF THE INVENTION

It is therefore a primary objective of the present invention to provide a drying method for removing a residual solution comprising dissolved oxygen from a semiconductor wafer so as to avoid water marks on a semiconductor wafer, and to avoid the use of chemical solutions so as to prevent environmental pollution.

In a preferred embodiment, the present invention provides a method for drying a semiconductor wafer to remove a residual solution from the semiconductor wafer, the residual solution comprising dissolved oxygen, the method comprising:

placing the semiconductor wafer into a chamber, then lowering the air pressure of the chamber to draw out the oxygen from the water drop on wafer and to maintain evaporation of the residual solution from the semiconductor wafer;

injecting an inert gas into the chamber to exchange the dissolved oxygen in the residual solution with the inert gas; and heating the semiconductor wafer to accelerate evaporation of the residual solution from the semiconductor wafer.

It is an advantage of the present invention that the drying method replaces the dissolved oxygen without the use of any chemical solutions, and dries the wafer in a vacuum. Thus, the drying method according to the present invention avoids the static charge issue, prevents the formation of water marks, and eliminates pollution from chemical drying solutions.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
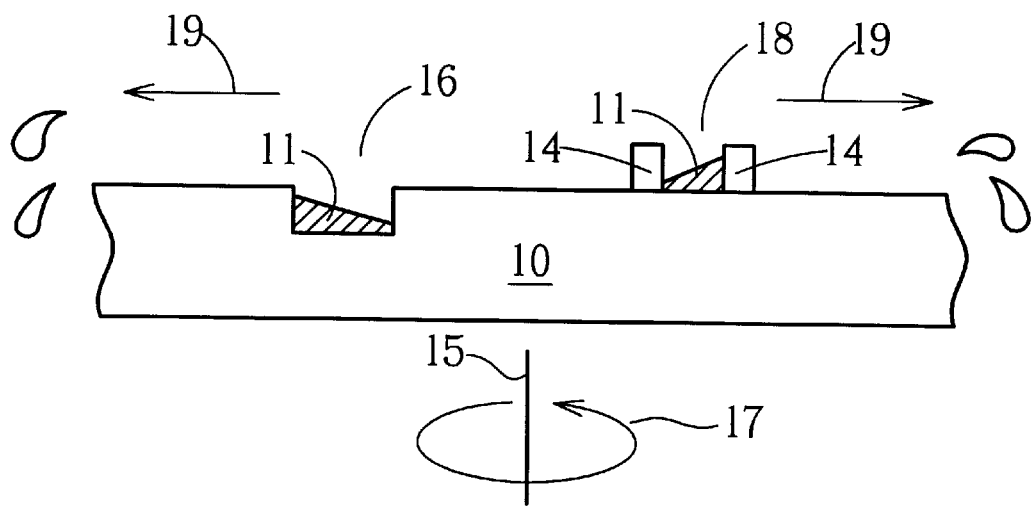
FIG. 1 is a cross-sectional diagram of a prior art spin drying process of a semiconductor wafer.
Figure 2:
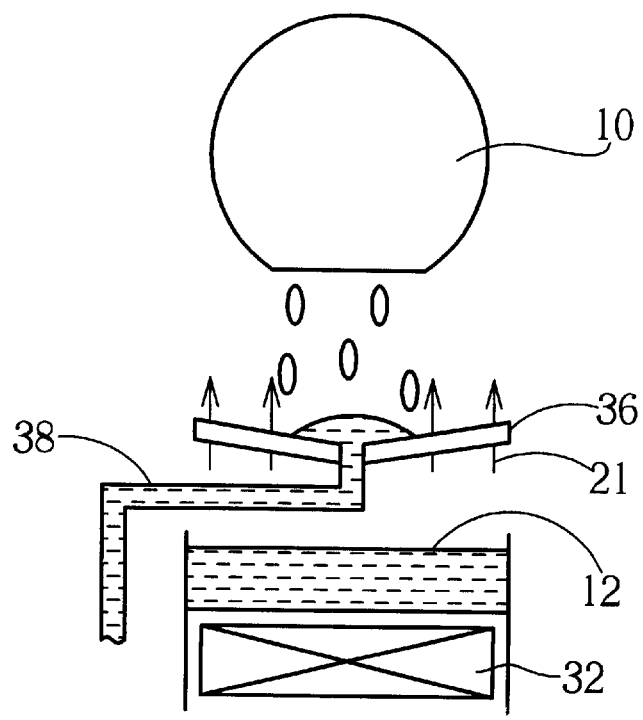
FIG. 2 is a schematic diagram of a prior art IPA vapor drying process of a semiconductor wafer.
Figure 3:
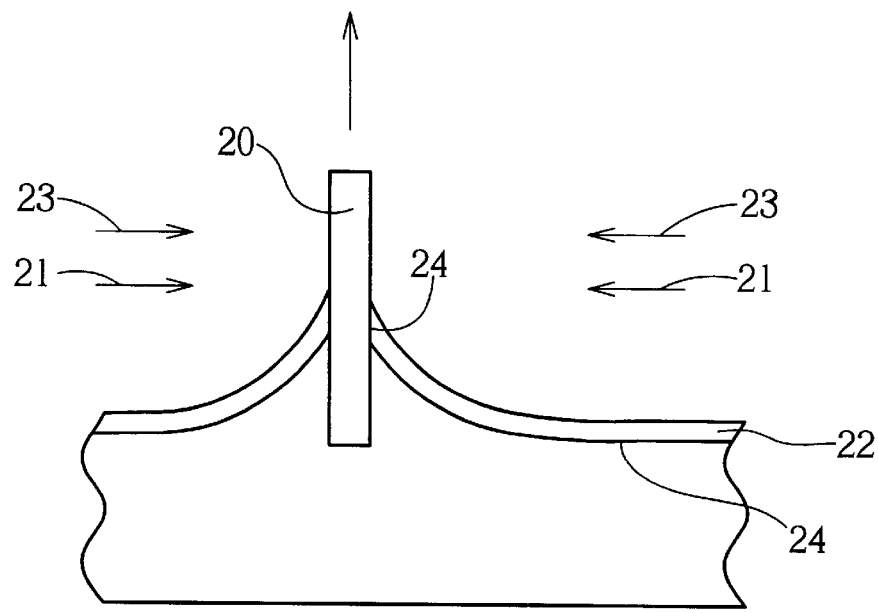
FIG. 3 is a side view of a prior art Marangoni drying process of a semiconductor wafer.
Figure 4:
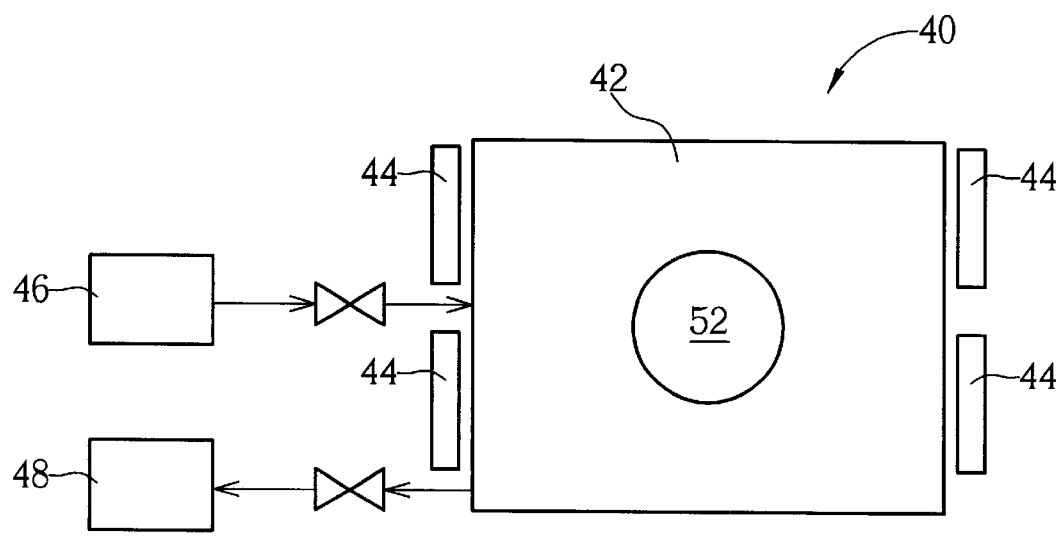
FIG. 4 is a schematic diagram of a drying apparatus for the method of drying a semiconductor wafer according to the present invention.

Please refer to FIG. 4. FIG. 4 is a schematic diagram of a drying apparatus of the method for drying a semiconductor wafer 52 according to the present invention. The method according to the present invention for drying the semiconductor wafer 52 is employed after washing the semiconductor wafer 52. The invention drying method can remove deionized water (DI water) from the surface of semiconductor wafer 52 to ensure the cleanliness of the surface. The drying apparatus 40 employed by the present invention comprises a chamber 42, a heater 44 made of a resist coil, a gas supply system 46 of nitrogen gas ($N_2$) or argon (Ar), and a vacuum system 48. During the drying process according to the present invention, the semiconductor wafer 52 is placed into the chamber 42, with the residual water remaining on the surface of the semiconductor wafer 52 from a prior washing process.

Figure 5:
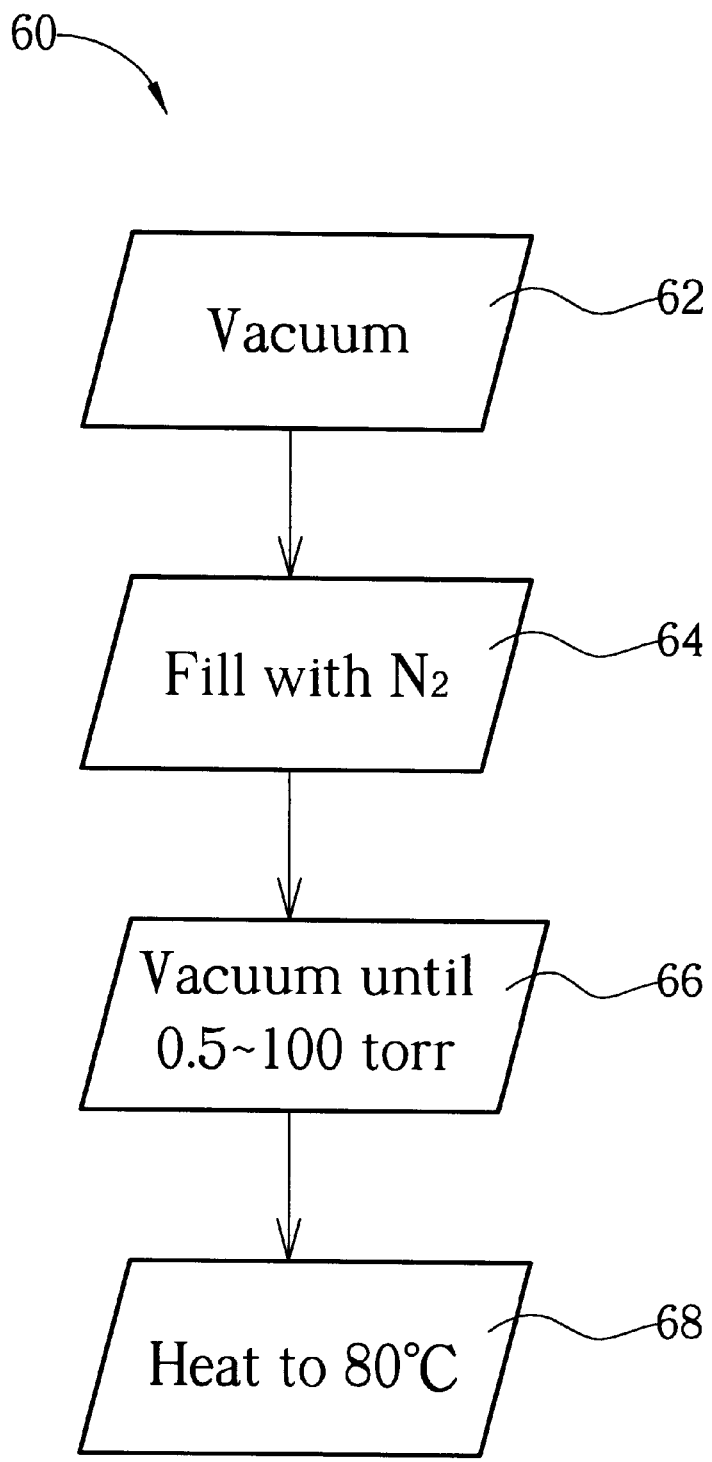
FIG. 5 is a flow chart of the method for drying the semiconductor wafer according to the present invention.

Please refer to FIG. 5. FIG. 5 is a flow chart 60 of the method for drying the semiconductor wafer 52 according to the present invention. The flow chart 60 comprises:

Step 62: Use the vacuum system 48 to lower the air pressure of the chamber 42 from atmospheric pressure to a predetermined air pressure so as to lower the partial pressure of oxygen in the chamber 42. Because of Henry's Law, as the partial pressure of oxygen in the chamber 42 lowers, the concentration of the oxygen dissolved in the water lowers as well.

Step 64: Use the gas supply system 46 to inject nitrogen gas (or argon gas) into the chamber 42 at a predetermined pressure with a predetermined flow. The purpose of step 64 is to replace the dissolved oxygen in the residual water with the nitrogen gas within a predetermined period of time. Similarly, other inert gasses could also be used to replace the dissolved oxygen in the residual water.

Step 66: Use the vacuum system 48 to lower the pressure in the chamber 42 down to 0.5~100 torr. This lowers the boiling point of the residual water. Meanwhile, the oxygen gas from the water, which has been replaced by nitrogen (or argon), is removed from the chamber 42 through the vacuum system 48.

Step 68: Perform a heating process to accelerate the evaporation of the residual water from the semiconductor wafer 52.

The processes of the method according to the present invention for drying the semiconductor wafer 52 involves first lowering the air pressure of the chamber 42 from atmospheric pressure to the predetermined pressure. Nitrogen gas (or argon gas) with a predetermined pressure is injected into the chamber 42 with a predetermined flow to replace the dissolved oxygen in the residual water. The pressure in the chamber 42 is brought down to 0.5~100 torr to remove the oxygen that has been replaced by the nitrogen gas. Finally, a heating process is performed to cause the evaporation of the residual water on the surface of the semiconductor wafer 52.

The heating process according to the present invention employs the heater 44 made of resist coil surrounding the chamber 42 to raise the temperature in the chamber 42 to 80° C. Similarly, the heater 44 can be a light (such as a heat lamp) to raise the temperature in the chamber 42. Since the pressure is lowered to 0.5~100 torr in the chamber 42, the boiling point of the water is brought down to below 80° C. Hence, the residual water continues to evaporate from the surface of the semiconductor wafer 52, and the invention avoids water marks and overcomes the shortcomings of the prior art methods which had difficulty with droplets in trenches and contact holes.

The primary purpose of the drying process according to the present invention is to completely remove from the semiconductor wafer 52 the residual water of a washing process, and to prevent oxygen dissolved in the water from oxidizing with the bare silicon of the wafer. The present method lowers the probability of oxidation between the oxygen and the semiconductor wafer 52 because of the low process pressure and temperature. The invention method replaces the dissolved oxygen with dissolved nitrogen to lower the concentration of oxygen in the water drop. Then, the method vaporizes the water drop in the vacuum so as to quickly dry the wafer at a low temperature. Hence, the drying time of each batch is decreased to two minutes, and the cycle time of the drying process is thereby decreased, further preventing the dissolved oxygen in the water from oxidizing with the surface of the bare silicon.

In contrast to the prior art method for drying the semiconductor wafer, the drying method according to the present invention dries the wafer in a vacuum where no static electricity exists so as to overcome the shortcomings of particle attraction caused by long spin dry process of the semiconductor wafer. Moreover, the method according to the present invention doesn't use any chemical solutions, so it reduces the overall environmental impact of the manufacturing process. The invention method shortens the drying time, prevents the formation of water marks, and overcomes the shortcomings of hard-to-reach droplets in trenches and contact holes. The invention method also prevents dissolved oxygen in the water from oxidizing with the surface silicon of the wafer.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A drying method for removing residual water drops containing dissolved oxygen from a wet semiconductor wafer, the method comprising:

placing the wet semiconductor wafer into an air-sealed chamber;

lowering the partial pressure of the oxygen in the chamber so as to expel the dissolved oxygen from the water drops and prevent the bare silicon surface from reacting with the dissolved oxygen and, at the same time, accelerating the evaporation of the residual water drops;

physically exchanging the dissolved oxygen in the residual water drops by a dry inert gas that is injected into the chamber, after lowering the partial pressure of the oxygen in the chamber, so that nearly no oxygen exists in the water drops;

evacuating the chamber pressure down to a predetermined pressure to remove both the expelled oxygen and inert gas from the chamber and to lower the boiling point of the residual water drops; and heating the semiconductor wafer to further accelerate the removal of the residual water drops from the semiconductor wafer;

wherein the interfaces between the residual water drops and the semiconductor wafer are not oxidized due to the reduction of the dissolved oxygen in the residual water drops during the drying of the wet wafer.

2. The method of claim 1 wherein the predetermined pressure is 0.5–100 torr.

3. The method of claim 1 wherein the dry inert gas is comprised of at least one of nitrogen and argon.

4. The method of claim 1 wherein the chamber and the wafer are both heated by means of a resistor coil.

5. The method of claim 1 wherein the residual water drops are comprised of de-ionized water and dissolved oxygen.

6. The method of claim 4 wherein the chamber temperature is raised to 80° C.

7. The method of claim 1 wherein the boiling point of the water is lowered to below 80° C.

8. The method of claim 1 wherein the dissolved oxygen in the residual water drops on the wet semiconductor wafer is physically exchanged by the dry inert gas, without the occurrence of a chemical reaction.

9. A drying method for removing residual water drops containing dissolved oxygen from a wet semiconductor wafer, the method comprising:

placing the wet semiconductor wafer into a chamber;

lowering the partial pressure of the oxygen in the chamber so as to expel the dissolved oxygen from the residual water drops and prevent the bare silicon surface from reacting with the dissolved oxygen and, at the same time, accelerating the evaporation of the residual water drops;

lowering the chamber pressure down to a predetermined pressure to remove the expelled oxygen from the chamber and to lower the boiling point of the residual water drops; and heating the semiconductor wafer to further accelerate the removal of the residual water drops from the wet semiconductor wafer;

wherein the interfaces between the residual water drops and the semiconductor wafer are not oxidized during the drying of the wet wafer due to the reduction of the dissolved oxygen in the residual water drops.

10. The method of claim 9 wherein the predetermined pressure is 0.5–100 torr.

11. The method of claim 9 wherein the chamber and the wafer are both heated by means of resistor coil.

12. The method of claim 11 wherein the chamber temperature is raised to 80° C.

13. The method of claim 9 wherein the boiling point of the water is lowered to below 80° C.

14. The method of claim 9 wherein the residual water drops are comprised of de-ionized water (DI water) and dissolved oxygen.

* * * * *